United States Patent
Shino

(10) Patent No.: US 6,830,779 B2
(45) Date of Patent: Dec. 14, 2004

(54) COATING METHOD FOR COATING LIQUID

(75) Inventor: Tokio Shino, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 56 days.

(21) Appl. No.: 10/307,281

(22) Filed: Dec. 2, 2002

(65) Prior Publication Data

US 2004/0001918 A1 Jan. 1, 2004

(30) Foreign Application Priority Data

Jun. 26, 2002 (JP) ........................................ 2002-186768

(51) Int. Cl.⁷ .............................. B05D 1/02; B05D 1/40
(52) U.S. Cl. ....................... 427/240; 427/286; 427/425; 118/52; 118/313; 118/314; 118/315; 118/320; 396/611; 430/313; 430/434
(58) Field of Search ................................. 427/240, 425, 427/421, 286; 118/313, 314, 315, 320, 52; 396/611; 430/313, 434

(56) References Cited

U.S. PATENT DOCUMENTS

| | | | | |
|---|---|---|---|---|
| 2,111,565 A | * | 3/1938 | Limerick | 427/187 |
| 5,571,560 A | * | 11/1996 | Lin | 427/240 |
| 5,720,814 A | * | 2/1998 | Takagi et al. | 118/319 |
| 5,972,426 A | * | 10/1999 | Kutsuzawa et al. | 427/240 |
| 6,017,392 A | * | 1/2000 | Cavallaro | 118/314 |
| 6,231,917 B1 | * | 5/2001 | Ito et al. | 427/9 |
| 6,238,747 B1 | * | 5/2001 | Marinaro et al. | 427/425 |
| 6,284,043 B1 | * | 9/2001 | Takekuma | 118/52 |
| 6,526,908 B2 | * | 3/2003 | Gardner et al. | 118/16 |

FOREIGN PATENT DOCUMENTS

JP 2001334198 12/2001

\* cited by examiner

*Primary Examiner*—Kirsten C. Jolley
(74) *Attorney, Agent, or Firm*—Volentine Francos & Whitt, PLLC

(57) ABSTRACT

A coating method for a coating liquid includes preparing a coating surface which has a plurality of regions that are to be coated with said coating liquid; providing a plurality of storage chambers under atmospheric pressure in which said coating liquid is stored in respective amounts that enable the coating surfaces of said corresponding regions being coated to be coated to substantially the same coating thickness; disposing said corresponding regions being coated on the undersides of said storage chambers; and applying said coating liquid on the coating surfaces of said regions being coated by pushing said coating liquid stored in said storage chambers by said atmospheric pressure.

19 Claims, 7 Drawing Sheets

COATING METHOD FOR COATING LIQUID

BACKGROUND OF THE INVENTION

1. Field of the Invention

The present invention relates to a coating apparatus and coating method for coating a substrate with a coating liquid, and more particularly relates to a coating method that is suitable for use in the application of developing solutions that remove undesired portions of the exposed film following exposure in photolithographic processes.

2. Description of Related Art

Among various types of LSI manufacturing processes, "photolithographic processes" are generally processes in which a desired circuit pattern is exposed (exposure process) by means of an exposure apparatus such as a reduction projection exposure apparatus or scanning type reduction projection exposure apparatus on a photosensitive resin material (hereafter referred to as a "resist") that has been applied as a coating to the surface of semiconductor substrate (hereafter referred to as a "wafer") by means of a resist coating apparatus, after which the exposed portions or unexposed portions are dissolved and removed (developing process), so that a positive type or negative type resist pattern is formed.

One example of a developing apparatus current used in such developing processes is a developing apparatus manufactured by Tokyo Electron K.K. E2 type developing nozzles are mounted in this developing apparatus. An outline of these E2 type developing nozzles will be described below.

For example, such E2 type developing nozzles have a construction in which a plurality of nozzles are installed side by side in a straight line above a disk-form wafer in positions corresponding to the diameter of this wafer. Furthermore, a developing solution is discharged as a coating liquid from the respective nozzles while the wafer is caused to rotate by ½ rotation (180°) at an arbitrary rpm, so that the entire surface of the wafer is covered by this developing solution. Afterward, the developing solution is held on the wafer for a specified developing time with the wafer in a stationary state, and the desired resist pattern is then obtained by successively performing a pure water rinsing step and a spin-drying step.

Furthermore, other developing apparatuses include developing apparatuses equipped with scanning type developing nozzles (developing apparatuses manufactured by Tokyo Electron K.K. and Dai-Nippon Screen Seizo K.K.). An outline of such scanning type nozzles will be described below.

In the case of scanning type developing nozzles, a construction is used in which a plurality of nozzles are provided side by side in a straight line for a length corresponding to the diameter of the disk-form wafer. Furthermore, after the nozzles are provided on the outside of the wafer, a developing solution is applied as a coating to the surface of the wafer from the respective nozzles while the nozzles are caused to perform a parallel movement (scan) over the surface of the stationary wafer, so that the entire surface of the wafer is covered by the developing solution.

Furthermore, in all of the developing apparatuses, commercially marketed products with the commercial names of NMD-3, NMD-W and the like (manufactured by Tokyo Oka Kogyo K.K.) are used as developing solutions.

In recent years, as the demand for dimensional precision in resist patterns has increased due to the increasing fineness and increasingly higher degree of integration of LSI, there has been a demand for a reduction in the amount of waste liquid discharged in LSI manufacturing processes, e.g., a reduction in the amount of waste developing solution in the developing processes, out of consideration for the environment.

SUMMARY OF THE INVENTION

It is an object of the present invention to provide a coating method which make it possible to apply a coating liquid with a uniform film thickness to a region being coated, such as the surface of a wafer or the like, and which also make it possible to reduce the amount of coating liquid used compared to conventional techniques.

According to one aspect of the present invention, there is provided a coating method for a coating liquid comprising the steps of: preparing a coating surface which has a plurality of regions that are to be coated with a coating liquid; providing a plurality of storage chambers under atmospheric pressure in which the coating liquid is stored in respective amounts that enable the coating surfaces of a corresponding regions being coated to be coated to substantially the same coating thickness; disposing the corresponding regions being coated on the undersides of the storage chambers; and applying the coating liquid on the coating surfaces of the regions being coated by pushing the coating liquid stored in the storage chambers by the atmospheric pressure.

According to the coating method of the present invention, since the amounts of coating liquid per unit area that are simultaneously supplied to the respective regions being coated are set as identical amounts, the coating liquid can be applied without causing any bias within the regions being coated in terms of the amount of coating liquid supplied to the regions being coated. Accordingly, the uniformity of the film thickness of the coating liquid that is formed on the regions being coated can be improved.

Furthermore, according to the coating method of the present invention, excessive supply of the coating liquid to the regions being coated can be suppressed, so that the amount of coating liquid used can be reduced compared to conventional techniques. Specifically, the amount of waste coating liquid generated in conventional techniques can be reduced.

BRIEF DESCRIPTION OF THE DRAWINGS

The foregoing and other objects, features and advantages of the present invention will be better understood form the following description taken in connection with the accompanying drawings, in which.

DESCRIPTION OF THE PREFERRED EMBODIMENTS

With reference to FIGS. 1 through 7, preferable embodiments of the present invention will be described herein below. Furthermore, the respective figures are perspective views and sectional views which schematically illustrate examples of the construction of the coating apparatus for a coating liquid provided by the present invention, and the coating method for a coating liquid provided by the present invention. Moreover, the respective schematic drawings to the referred show merely, the shapes, sizes and arrangement of the respective constituent components on such a level, that the invention can be understood. Accordingly, the present invention is not limited to illustrated embodiments. Furthermore, specified materials, conditions and the like may be used in the following description; however, these materials and conditions are merely examples of application, and there is no limitation of the present invention to these materials or conditions. Moreover, in the embodiments of construction described below in regard to the coating apparatus, a coating apparatus used for a developing solution in which the coating liquid applied to an exposed substrate (wafer) is a developing solution used for a resist pattern, and this developing solution is applied by the coating apparatus, is described as an example; however, applications of the coating apparatus of the present invention are not limited to this.

<First Embodiment>

A coating apparatus for a coating liquid and coating method for a coating liquid constituting a first embodiment of the present invention will be described with reference to FIGS. 1(A)–3(D).

Figure 1A:
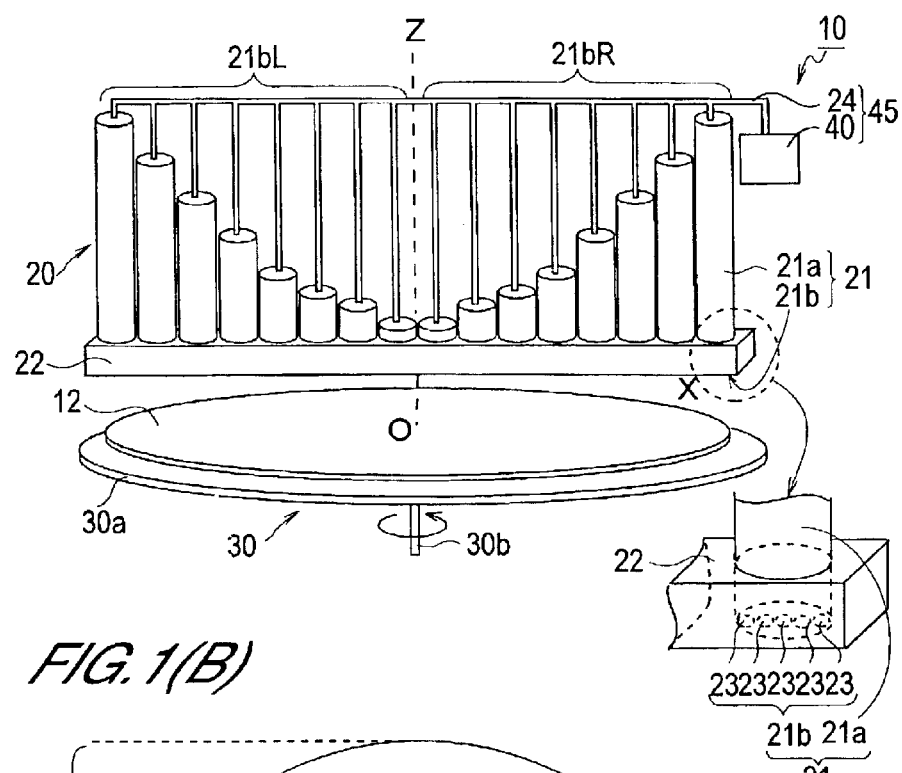
FIGS. 1(A) and 1(B) are diagrams used to illustrate the liquid coating apparatus of a first embodiment of the present invention.

FIG. 1(A) is a perspective view which schematically shows the coating apparatus 10 of the present embodiment. As is shown in FIG. 1(A), the coating apparatus 10 comprises a substrate rotating part 30, a coating liquid discharge part assembly 20, and a discharge control part 45. In addition to a rotating stand 30a on which the exposed disk-form substrate (wafer) 12 (the resist formed as a film on the substrate is not shown in the figures) is placed, and a rotational driving shaft 30b, the substrate rotating part 30 has a driving source (not shown in the figures) such as a motor or the like which causes the substrate 12 to rotate at a specified rotational speed about an axis perpendicular to the center of the substrate 12 (central axis of rotation or rotational axis Z). The coating liquid discharge part assembly 20 comprises a plurality of coating liquid discharge parts 21 which coat regions on one main surface side of the disk-form substrate 12 placed on the rotating stand 30a with a developing solution as a coating liquid. The discharge control part 45 comprises a coating liquid supply part 40 which controls the initiation/stopping of the discharge (supply) of the developing solution from the respective coating liquid discharge parts 21, and a communicating pipe (also called a supply pipe) 24 which communicates between the coating liquid supply part 40 and the respective coating liquid discharge parts 21. The discharge control part 45 fills the respective coating liquid discharge parts 21 with the developing solution, and simultaneously controls the load pressure on the developing solution.

Each of the coating liquid discharge parts 21 making up the coating liquid discharge part assembly 20 comprises a coating liquid buffer part 21a used as a storage chamber (accommodating part) constituting a tank made of a [poly] vinyl chloride or Teflon (registered trademark) resin or the like which can store the developing solution (not shown in the figures) used as the coating liquid inside, and a coating liquid nozzle part 21b (see the enlarged schematic diagram of the region X surrounded by a broken line in the figure) equipped with (for example) five openings (discharge ports) 23, which is used as a nozzle part that applies the coating liquid to the substrate. This coating liquid buffer part 21a and coating liquid nozzle part 21b may be installed separately or as an integral unit.

In this embodiment of construction, the respective coating liquid buffer parts 21a are cylindrical bodies (or pipe-form bodies) which have substantially the same cross-sectional shape, but which differ from each other in length. The upper part of each cylindrical body communicates with the coating liquid supply part 40 via the communicating pipe 24. Meanwhile, the lower part of each cylindrical body functions as the coating liquid nozzle part 21b, with opening parts of the same size provided in a single row in the bottom part of each cylindrical body. The respective coating liquid buffer parts 21a are provided in a single row at a fixed spacing.

In this embodiment, the coating liquid discharge parts 21 are installed side by side in a single rectilinear row from the central axis of rotation Z of the substrate 12 in a direction (toward the outer circumference) perpendicular to the central axis of rotation Z. In this case, a construction is used in which equal numbers of the coating liquid discharge parts 21 are installed in symmetrical positions on both sides of the central axis of rotation Z, e. g., in which eight coating liquid discharge parts 21 are installed on each side. In other words, a construction is used in which a total of 16 coating liquid discharge parts 21 are installed, with equal numbers of these parts being installed on both sides of the central axis of rotation Z, i. e., in positions showing left-right symmetry across the diameter of the substrate 12. Accordingly, eight coating liquid nozzle parts 21b are installed in a single row in the radial direction extending from the central axis of rotation Z on each side of the central axis of rotation Z, and the opening parts 23, five of which are provided in each coating liquid buffer part 21a, are installed side by side in a single row across the diameter of the substrate 12. Furthermore, in this example of construction, the opening parts 23 have the same shape and opening area.

Furthermore, in the figures, for the sake of convenience, the eight coating liquid nozzle parts 21b that are installed side by side on the right side of the central axis of rotation Z are referred to collectively as the first coating liquid nozzle parts 21bR, and the eight coating liquid nozzle parts 21b that are installed side by side on the left side of the central axis of rotation Z are referred to collectively as the second coating liquid nozzle parts 21bL.

The respective coating liquid discharge parts 21 are supported by a supporting part 22 so that these coating liquid discharge parts 21 are provided in a direction that is perpendicular (vertical) with respect to one of the main surfaces (i.e., the coating surface) of the substrate 12 that constitutes the regions that are coated with the coating liquid, and so that the coating liquid discharge parts 21 are aligned substantially in a single row. In other words, each of the coating liquid buffer parts 21a with which the coating liquid discharge parts 21 are equipped is installed so that this coating liquid buffer part 21a extends in a direction perpendicular to the coating surface.

Furthermore, the substrate rotating part 30 that is provided facing the coating liquid discharge part assembly 20 is caused to rotate by ½ rotation (180°) at a specified rotational speed in the direction indicated by the arrow in the figure. At the same time that this rotation begins, the developing solution is discharged from the respective coating liquid nozzle parts 21b, so that the surface of the rotating substrate 12 is coated.

In this embodiment, the volume of the developing solution (constituting the coating liquid) that can be stored by each of the coating liquid buffer parts 21a (this will also be referred to simply as the "volume" in some cases) is set so that this volume increases in the order in which the coating liquid nozzle parts 21b are arranged from the side of the central axis of rotation Z of the substrate 12 toward the outer circumference of the substrate 12. Specifically, the storage volumes of the respective coating liquid buffer parts 21a increase as these parts are removed from the central axis of rotation Z in the radial direction of rotation of the substrate 12.

When the coating liquid is applied, it is necessary that the developing solution constituting the coating liquid be applied with a uniform thickness over the entire surface of the substrate 12 using the left and right sets of the coating liquid nozzle parts 21bR and 21bL. In this case, one semicircular region of the substrate, which is split into two such regions by the diameter of the substrate, is coated by the first coating liquid nozzle parts 21bR, while the other semicircular region is coated by the second coating liquid nozzle parts 21bL. Accordingly, the substrate surface regions whose coating is performed by the respective nozzles of the first coating liquid nozzle parts 21bR aligned in the radial direction of the substrate differ from the substrate surface regions show coating is performed by the respective nozzles of the second coating liquid nozzle part 21bL. Consequently, each coating liquid buffer part 21a must store an amount of developing solution that corresponds to the product of the substrate surface region covered by this coating liquid buffer part 21a and the coating thickness. For this reason the respective coating liquid buffer parts 21a have storage capacities that increase with the distance of the coating liquid buffer parts 21a from the center of the substrate 12 toward the edge of the substrate 12. This storage capacity is determined by the radius of the coated circular region centered on the central axis of the substrate 12, the number of coating liquid discharge parts 20 that are aligned on this radius, and the coating thickness. Furthermore, it is sufficient of this amount of developing solution that is stored is the coating amount required for a single substrate.

Figure 1B:
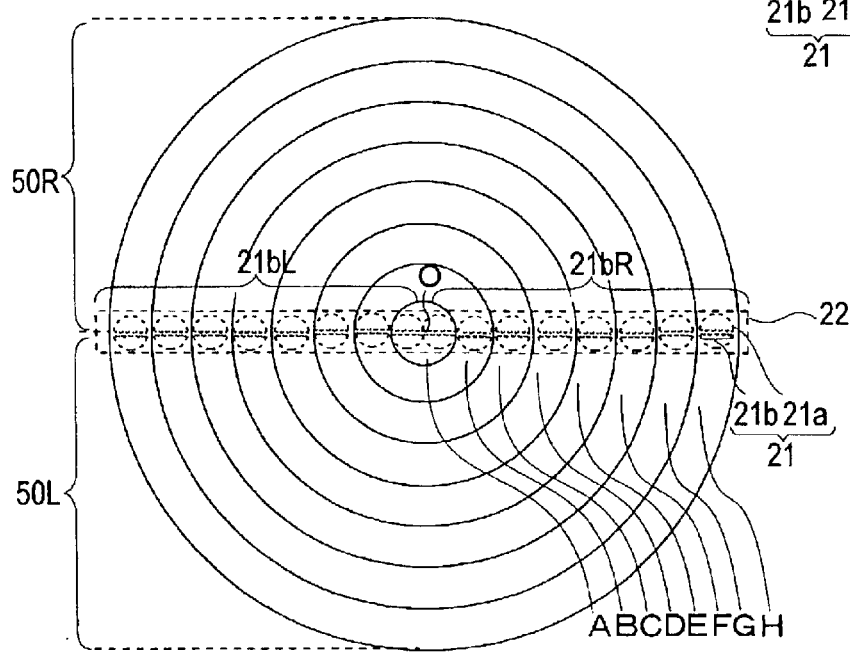

Next, the coating apparatus 10 of the present embodiment will be described in greater detail with reference to FIG. 1(B). FIG. 1(B) is an explanatory diagram of the regions on the substrate 12 that are coated with the developing solution constituting the coating liquid that is discharged from the respective coating liquid nozzle parts 21b in the abovementioned construction (the coating method will be described later). As was described above, first and second coating liquid nozzle parts (21bR, 21bL) are provided in left-right symmetrical positions on both sides of the central axis of rotation Z. Accordingly, as is shown in FIG. 1(B), the regions on the substrate 12 that are coated with the developing solution by the respective nozzle parts are a circular region A that is centered on the center of rotation O, and annular regions (B, C, D, E, F, G, H) that are successively formed in the outer periphery of the circular region A, and that are all centered on the center of rotation O.

When the substrate 12 rotates in the counterclockwise direction in the figure, the semicircular region 50R on the upper side of FIG. 1(B) (among the regions on the upper surface of the substrate) is the region that is coated with the developing solution discharged from the first coating liquid nozzle parts 21bR, and the semicircular region 50L on the lower side of the figure is the region that is coated with the developing solution discharged from the second coating liquid nozzle parts 21bL.

In this case, the areas of the regions on the substrate 12 that are coated with the developing solution increase as the coating liquid nozzle parts 21b that discharge the developing solution are located further away from the center of rotation O of the substrate 12 in the direction of the edge of the substrate 12. Accordingly, in the coating apparatus 10 of the present embodiment, the volumes of the coating liquid buffer parts 21a corresponding to the coating liquid nozzle parts 21b are set so that these volumes increase in accordance with the increase in the areas of the coating regions, as was already described above.

Here, in FIG. 1(B), A, B, C, D, E, F, G and H also indicate the areas of the respective regions. For example, in the application of a developing solution to a substrate (wafer) with a diameter of 200 mm (following exposure of the wafer) using the coating apparatus 10, the areas on the substrate 12 that are coated with the developing solution (constituting the coating liquid) by the respective coating liquid nozzle parts 21b (eight nozzle parts) of the first coating liquid nozzle parts 21bR are areas equal to half of the respective annular regions. As one example, in order from the coating liquid nozzle parts 21b on the side of the center of rotation O, A=approximately 245.3 mm$^2$, B=approximately 735.9 mm$^2$, C=approximately 1226.6 mm$^2$, D=approximately 1717.2 mm$^2$, E approximately 2207.8 mm$^2$, F=approximately 2698.4 mm$^2$, G=approximately 3189.1 mm$^2$, and H=approximately 3679.7 mm$^2$ (the coating width is calculated as approximately 12.5 mm).

Furthermore, the coating thickness of the developing solution on the substrate, i.e., the height of the developing solution (height of the standing liquid), actually differs according to the contact angle between the resist formed on the surface of the substrate 12 and the developing solution that is used, and the area of the resist that is dissolved by the developing solution. In this present example of construction, there is no deficiency if the height of the developing solution is set at approximately 1 mm. Accordingly, for example, in a case where the height of the developing solution is set at approximately 1 mm, the volumes of the coating liquid buffer parts 21a corresponding to the outside coating liquid nozzle parts 21b from the respective coating liquid nozzle parts 21b of the first coating liquid nozzle parts 21bR are as follows in order from the region A corresponding to the coating liquid nozzle part 21b on the side of the center of rotation O to the region H: approximately 245.3 mm$^3$, approximately 735.9 mm$^3$, approximately 1226.6 mm$^3$, approximately 1717.2 mm$^3$, approximately 2207.8 mm$^3$, approximately 2698.4 mm$^3$, approximately 3189.1 mm$^3$, and approximately 3679.7 mm$^3$. Furthermore, in the present example of construction, the diameter of the five circular openings 23 that constitute each coating liquid nozzle part 21b is set at approximately 1 mm. Moreover, respective coating liquid buffer parts 21a with the same volumes as those described above are also provided on the side of the second coating liquid nozzle parts 21bL as well.

Figure 2A:
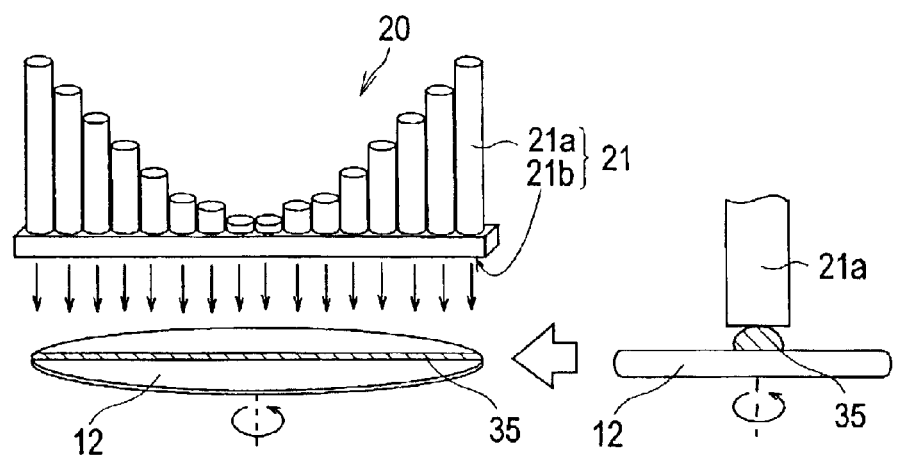
FIGS. 2(A) through 2(C) are diagrams used to illustrate a liquid coating method using the liquid coating apparatus of the first embodiment of the present invention.
Figure 2B:
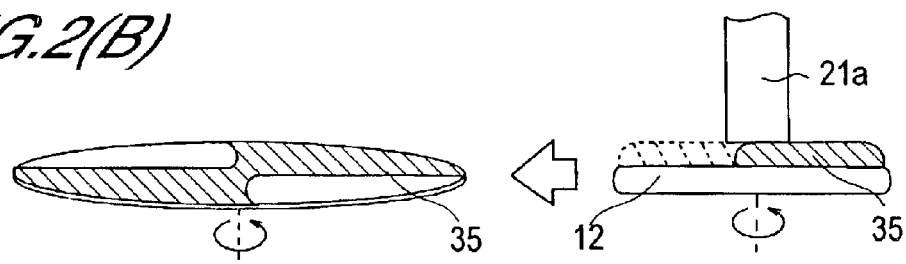
Figure 2C:
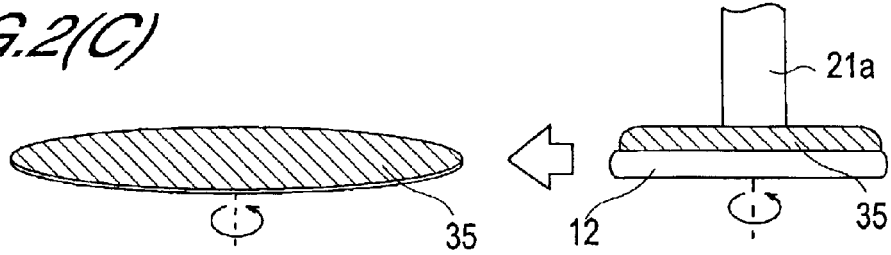

Next, a coating liquid coating method for a coating liquid using the coating apparatus 10 will be described with reference to FIGS. 2(A)–2(C). Furthermore, in FIGS. 2(A) through 2(C), the schematic diagrams on the right side of each diagram show the coating conditions of the substrate 12 coated with the developing solution 35 by the coating apparatus 10 shown on the left side as seen from the direction indicated by the white arrows. Moreover, the portion of the region surrounded by a broken line shown on the right side of FIG. 2(B) is the portion that is coated by the second (left-side) coating liquid nozzle parts 21bL.

First, in the waiting position, the respective empty coating liquid buffer parts 21a having the abovementioned volumes in the coating liquid discharge part assembly 20 are filled (this is not shown in the figures) with volumes of the developing solution that are equal to the volumes of these coating liquid buffer parts 21a from the coating liquid supply part 40 via the communicating pipe 24. Furthermore, a conventionally used developing solution to which no surfactant has been added (e.g., NMD-3 (manufactured by Tokyo Oka Kogyo K.K., specific gravity approximately 1.05 and viscosity approximately 0.9 cP (both at 25° C.))) or a developing solution to which a surfactant has been added (e.g., NMD-W (manufactured by Tokyo Oka Kogyo K.K.)) may be used as the developing solution. During the filling process of this developing solution, and even after the filling process is completed, the relationship between the area of the nozzle discharge openings and the physical properties of the developing solution is such that there is no undesirable leakage of the developing solution, especially if no external force is applied to the coating liquid buffer parts 21a. Furthermore, the developing solution inside the coating liquid buffer parts 21a following filling is at a pressure that is below atmospheric pressure (negative pressure).

Afterward, the coating liquid discharge part assembly 20 is moved together with the supporting body 22 to a position that is located above the disk-form substrate (with a diameter of 200 mm; the resist is not shown in the figures) 12 placed on the substrate rotating part 30 and that is located on a straight line (diameter) that passes through the center of rotation O of the substrate 12, and is stopped in a position which is such that the gap between the surface of the substrate 12 and the coating liquid nozzle parts 21b is approximately 1 mm.

Next, with the substrate 12 in a stationary state, an initial stimulus is instantaneously applied to the respective coating liquid buffer parts 21a from the coating liquid supply part 40 (see FIG. 1(A)) via the communicating pipe 24. As one example, an initial discharge operation is performed in which this initial stimulus is applied as a pressure load. For example, nitrogen ($N_2$) gas pressurized to a pressure of 0.1 kg/cm$^2$ is supplied to the respective coating liquid buffer parts 21a via the communicating pipe 24. As a result, the interiors of the respective coating liquid buffer parts 21a are instantaneously pressurized, so that a portion of the developing solution 35 is initially discharged onto the substrate 12 via the coating liquid nozzle parts 21b (FIG. 2(A)).

Following this initial discharge operation, the pressurization by means of the coating liquid supply part 40 is stopped, so that the interiors of the respective coating liquid buffer parts 21a are set at atmospheric pressure, and rotation of the substrate 12 at a rotational speed of 30 rpm in the direction indicated by the arrow is initiated. At the same time that this rotation is initiated, the developing solution 35 is pushed by atmospheric pressure from the respective coating liquid nozzle parts 21b of the first and second coating liquid nozzle parts (21bR, 21bL), so that this developing solution 35 is continuously discharged from the openings 23 and applied to the surface of the substrate 12.

For example, when a time of 0.5 seconds has elapsed, the substrate 12 has rotated ¼ rotation (90°) in the direction indicated by the arrow; accordingly, at this instant, approximately ½ of the substrate 12 has been coated with the developing solution 35 (FIG. 2(B)). Furthermore, when 1 second has elapsed, the interiors of the coating liquid buffer parts 21a are placed under a negative pressure by the coating liquid supply part 40, so that the discharge of the developing solution 35 is stopped. Furthermore, the rotation of the substrate 12 is stopped at the same time that the discharge is stopped.

Afterward, the coating liquid discharge part assembly 20 is moved so that the gap between the substrate 12 and the coating liquid nozzle parts 21b is approximately 5 mm. Thus, since the substrate 12 has rotated ½ rotation (180°) in the direction indicated by the arrow when a time of 1 second has elapsed, the entire surface of the substrate 12 is coated with the developing solution 35 (FIG. 2(C)).

Furthermore, the discharge of the developing solution 35 onto the upper surface of the substrate 12, i.e., the application of the developing solution 35 to the upper surface of the substrate 12 as a coating, is accomplished by utilizing the fact that the force that acts between the developing solution 35 on the substrate 12 and the developing solution 35 at the tip ends of the coating liquid nozzle parts 21b, i.e., the interfacial tension between the developing solution 35 and the substrate 12, is greater than the interfacial tension between the developing solution 35 and the wall surfaces of the coating liquid buffer parts 21a. Accordingly, even if the areas of the discharge ports of the respective coating liquid nozzle parts 21b are the same, the amounts of developing solution that are discharged from the respective discharge ports within the same period of time are proportional to the distance by which the respective coating liquid nozzle parts 21b move over the surface of the substrate in relative terms. Furthermore, since the entire amount of developing solution 35 stored in the respective coating liquid buffer parts 21a is discharged after 1 second has elapsed, substantially no developing solution 35 remains in these respective coating liquid buffer parts 21a, so that substantially all of the developing solution 35 with which the coating liquid buffer parts 21a were filled is caused three-dimensional orthogonal coordinate system over the surface of the substrate 12.

Subsequently, after the substrate 12 has been maintained in a stationary state for a specified developing time, the desired resist pattern is obtained by successively performing a pure water rinsing step and a spin-drying step. Furthermore, while the pure water rinsing step and spin-drying step are being performed, the coating liquid discharge part assembly 20 may be moved to the waiting position, and the respective empty coating liquid buffer parts 21a that have been used may be filled with fresh developing solution and prepared for the next developing process.

In the liquid coating apparatus of the present embodiment, as is clear from the above description, the amount of developing solution stored in each coating liquid buffer part 21a increases as this coating liquid buffer part 21a is located in a position further from the center of rotation O of the substrate 12 in the radial direction. Accordingly, each coating liquid buffer part 21a is provided as a storage part which has the same volume as the required amount of developing solution calculated from the area of the region being coated that corresponds to the respective coating liquid discharge part 21 associated with this coating liquid buffer part 21a.

As a result, the amount of developing solution that is discharged per unit area during the same time period is constant at every location on the upper surface of the substrate 12, so that there is no bias in the amount of developing solution supplied to the substrate 12 within the plane of the substrate 12; accordingly, a uniform film thickness can be obtained in the developing solution that covers the substrate.

Furthermore, for each coating region, the amount of developing solution that is stored in the corresponding coating liquid buffer part 21a is set as the amount that is used up for one substrate. Accordingly, the excessive supply of developing solution to the substrate 12 can be prevented. Consequently, the amount of developing solution used can be reduced compared to conventional methods.

Figure 3A:
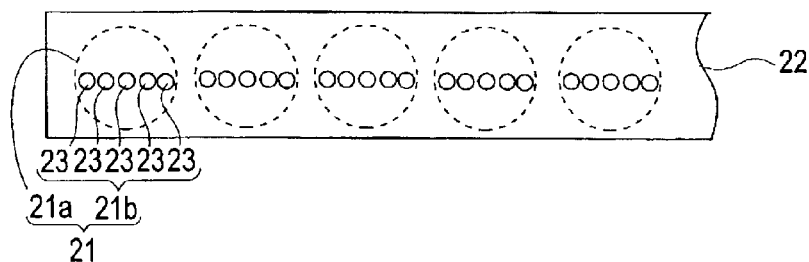
FIGS. 3(A)–3(D) are diagrams used to illustrate the liquid coating apparatus of the first embodiment of the present invention.
Figure 3B:
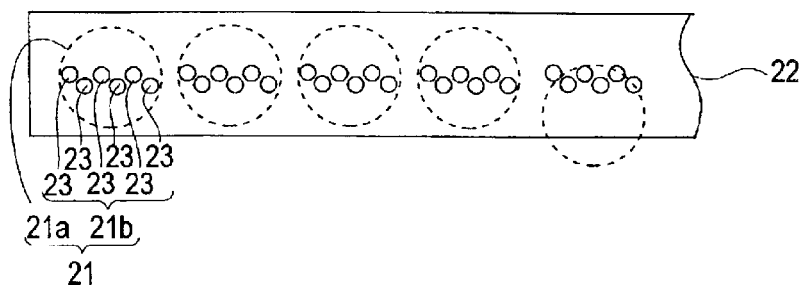
Figure 3C:
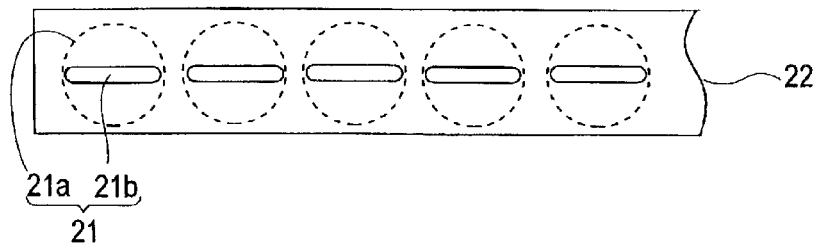
Figure 3D:
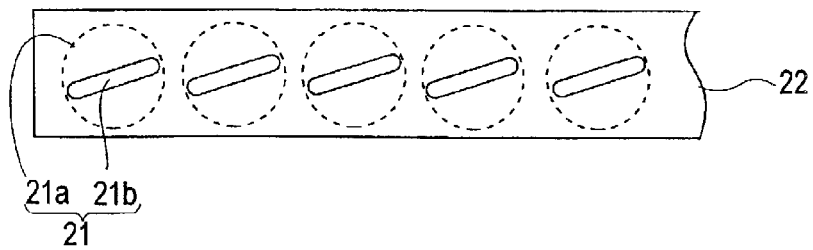

Furthermore, in this embodiment, the coating liquid nozzle parts 21b installed for each coating liquid discharge part 21 were constructed so that these coating liquid nozzle parts 21b consisted of five opening parts 23 arranged rectilinearly in a single row (FIG. 3(A)); however, the number, area and shape of the opening parts 23 may be arbitrarily set in accordance with the intended use and design. For example, it would also be possible to use a construction in which the opening parts are alternately provided in a waveform shape as shown in FIG. 3(B). Alternatively, it would also be possible to use a construction in which a single slit-form opening is installed in a straight line or an inclined orientation for each liquid discharge part 21 as shown in FIG. 3(C) or 3(D) (the same is also true of embodiments described below).

<Second Embodiment>

A coating apparatus for a coating liquid and a coating method for a coating liquid constituting a second embodiment of the present invention will be described with reference to FIGS. 4 through 7. Furthermore, constituent elements that are the same as constituent elements already described with reference to FIGS. 1 through 3 are indicated by the same numeric characters, and a concrete description of such constituent elements may be omitted.

Figure 4A:
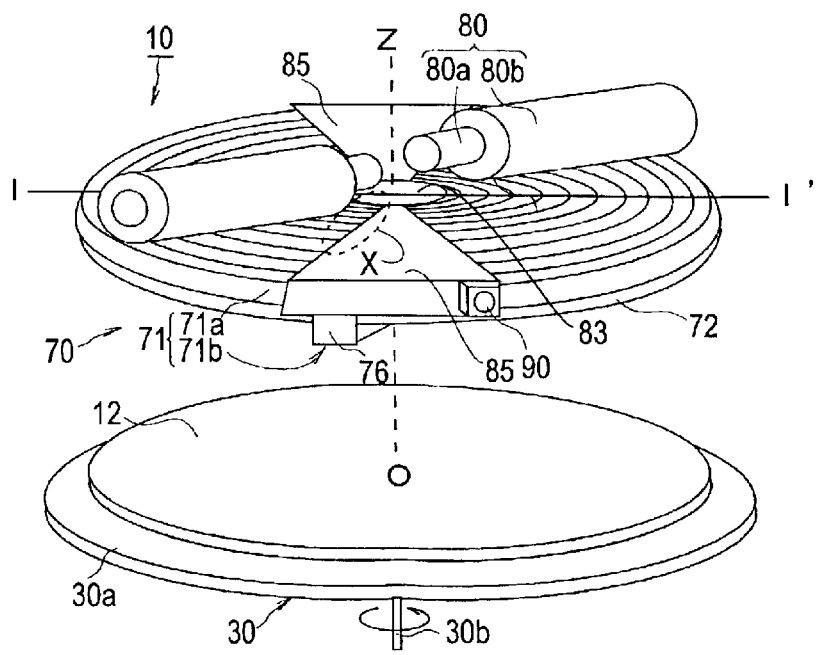
FIGS. 4(A) through 4(D) are diagrams used to illustrate the liquid coating apparatus of a second embodiment of the present invention.

FIG. 4(A) is a perspective view which schematically shows the coating apparatus 10 of this embodiment. As is shown in FIG. 4(A), the coating apparatus 10 comprises a substrate rotating part 30 similar to that described in the abovementioned first embodiment, a supporting plate 72, a coating liquid discharge part assembly 70 which is mounted on this supporting plate 72, a discharge control part 87 (in the figures, only the rollers 80 belonging to the discharge control part 87 are shown), and piping parts 85. The coating liquid discharge part assembly 70 comprises a plurality of coating liquid discharge parts 71 that apply a developing solution as a coating liquid to regions on one of the main surfaces of a disk-form substrate 12 that is mounted on a rotating stand 30a. The piping parts 85 accommodate piping and the like (only one of the coating liquid supply ports 90 is shown in the figures) that supplies the developing solution to the respective coating liquid discharge parts 71; these piping parts 85 have a fan-form shape with a center angle of approximately 45°.

Furthermore, according to a characterizing feature of this embodiment, the discharge control part 87 comprises push-out parts that simultaneously control the initiation and stopping of the discharge (supply) of developing solution from the respective liquid discharge parts 71 by means of the load pressure on the developing solution. A pair of rollers 80 that are provided on either side of the central axis of rotation Z are provided as these push-out parts (for details, see FIG. 5).

Next, the coating apparatus 10 of this embodiment will be described in greater detail.

Figure 4B:
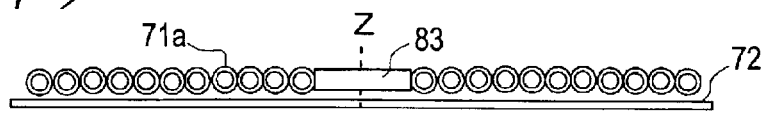

FIG. 4(B) is a diagram which shows a schematic sectional view along line I–I' in FIG. 4(A). As is shown in FIG. 4(B), A plurality of tubes 71a (eleven tubes in this case) constituting the coating liquid discharge parts 71, which are used as storage chambers (accommodating parts) consisting of tubular members that possess elasticity and that can store a developing solution (not shown in the figures) inside, are provided on the horizontal supporting plate 72 that supports these tubes 71a, with the tubes 71a being aligned along this supporting plate 72. Specifically, the respective tubes 71a are provided along the coating surface. Furthermore, these tubes 71a are positioned and fastened to the supporting plate 72 by means of an appropriate fastening part such as an adhesive agent or the like (not shown in the figures). A coating liquid nozzle part 71b is provided on one end of each tube 71a. The other end is caused to communicate with one of the coating liquid supply ports 90 via a communicating pipe (not shown in the figures). These coating liquid nozzle parts 71b and coating liquid supply ports 90 are installed in the piping parts 85. In the example of construction shown in FIG. 4(A), a plurality of the tubes 71a are installed side by side corresponding to respective semicircular regions formed by splitting the circular substrate 12 into two parts by a diameter that passes through the center of the substrate; accordingly, two piping parts 85 are installed on a diameter that passes through the center of the supporting plate 72 in positions that are symmetrical with respect to this center, so that the respective semicircular regions can be coated with the developing solution.

Figure 4C:
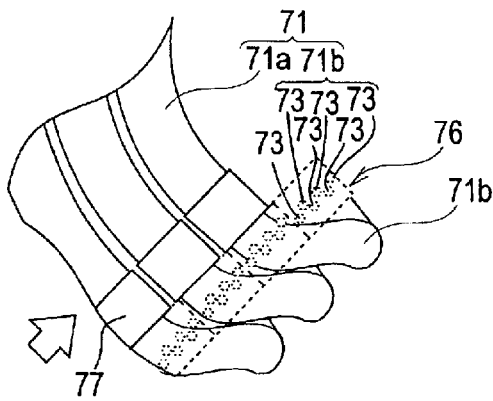
Figure 4D:
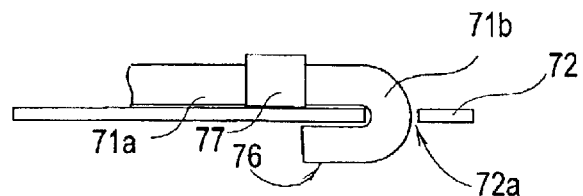

FIG. 4(C) is an enlarged schematic diagram of the region X surrounded by a broken line in FIG. 4(A). FIG. 4(D) shows FIG. 4(C) as seen from the direction indicated by the white arrow in the figure. As is shown in FIG. 4(C), each of the liquid discharge parts 71 constituting the coating liquid discharge part assembly 70 comprises a tube 71a used as a tubular member which possesses elasticity and which can store a developing solution (not shown in the figures) inside, and a coating liquid nozzle part 71b which is connected to one end of the tube 71a via a connecting part 77. A plurality of openings (discharge ports) 73 which discharge the developing solution onto the substrate 12 are formed in the tip end portion 76 of each coating liquid nozzle part 71b. Furthermore, the respective coating liquid discharge parts 71 are fastened to the supporting plate 72 by the connecting parts 77 so that these coating liquid discharge parts 71 are arranged in a single row in the horizontal direction on the supporting plate 72. Furthermore, as is shown in schematic terms in FIG. 4(C) and FIG. 4(D), the coating liquid nozzle parts 71b pass through holes or cut-out grooves 72a formed in the supporting plate 72 in the respective piping parts 85, and are bent so that these coating liquid nozzle parts 71b extend toward the back side from the surface side on which the tubes 71a are provided. Furthermore, one or more openings 73 are formed in the tube walls of the tip end portions 76 of these extended coating liquid nozzle parts 71b that face the substrate.

Figure 5:
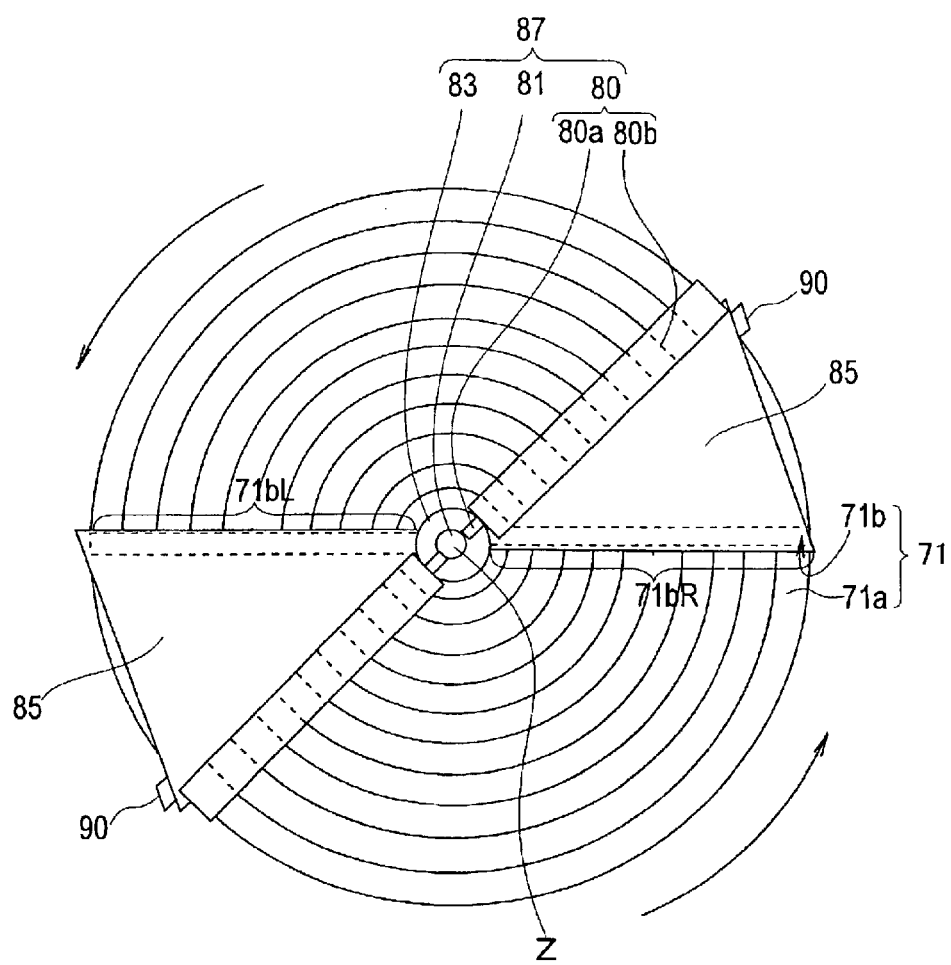
FIG. 5 is a diagram used to illustrate the liquid coating apparatus of the second embodiment of the present invention.

FIG. 5 is a schematic plan view which shows the coating apparatus of the present embodiment.

As is shown in FIG. 5, eleven tubes 71a are provided so that these tubes 71 describe concentric circular arcs of approximately 135° about the central axis of rotation Z. Furthermore, coating liquid nozzle parts 71b that are connected to one end of each of the tubes 71a are installed in a number equal to the number of tubes 71a, so that eleven of these coating liquid nozzle parts 71b are installed side by side from the central axis of rotation Z of the substrate 12 in the direction perpendicular to this axis (i.e., toward the outer circumference). In this embodiment, a construction is used which includes a total of 22 coating liquid nozzle parts 71b, with eleven of these nozzle parts 21b installed in symmetrical positions on either side of the central axis of rotation Z. Furthermore, the nozzle tip end portions 76 in which the openings 73 of the coating liquid nozzle parts 71*b* are formed may also be constructed by partitioning the interior of a single long nozzle member that is common to all of the nozzle tip end portions 76 by means of partition walls. Alternatively, the nozzle tip end portions 76 may be separately formed by respective separate nozzle members, and then connected to each other.

Furthermore, in the figures, the eleven coating liquid nozzle parts 71*b* that are installed side by side on the right side of the of the central axis of rotation Z are referred to collectively as the first coating liquid nozzle parts 71*b*R. Moreover, the eleven coating liquid nozzle parts 71*b* that are installed side by side on the left side of the central axis of rotation Z are referred to collectively as the second coating liquid nozzle parts 71*b*L.

Furthermore, the discharge control part 87 comprises rollers 80, a rotational drive shaft 81 and a rotational driving source 83. Each roller 80 comprises a roller shaft part 80*a* and a rotating part 80*b* that can rotate about this roller shaft part 80*a*. This rotating part 80*b* is split so that the rotating part 80*b* can perform a rotational movement at a different rpm for each tube 71*a* contacted by the rotating part 80*b*. The positions of these splits are indicated by broken lines in the figures. Furthermore, the roller shaft parts 80*a* are connected to the rotational drive shaft 81, which can rotate about the central axis of rotation Z. Moreover, in accordance with the rotational drive shaft 81 that is caused to move by the driving of the rotational driving source 83, the rollers 80 move from the side of the coating liquid supply port 90 at one end of each tube 71*a* toward the side of the coating liquid nozzle part 71*b* at the other end while pressing the tubes 71*a*. Furthermore, since the rotating parts 80*b* of the rollers 80 are split for each of the tubes 71*a* that is pressed, the friction that is generated by the difference in rotation between the outer circumferential side and inner circumferential side during the rotation of the rollers can be alleviated. Moreover, a hard synthetic resins (e.g., polyvinyl chloride, diflon or the like), a metal (SUS) or the like can be used as the material that constitutes the rotating parts 80*b*.

Then, the substrate rotating part 30 that is provided facing the coating liquid discharge part assembly 70 is caused to rotate by ½ rotation (180°) at a specified rotational speed in the direction indicated by the arrow, and at the same time, the developing solution inside the tubes 71*a* pressed by the rollers 80 is discharged from the respective coating liquid nozzle parts 71*b* so that the surface of the substrate is coated with this developing solution.

In this embodiment, as in the first embodiment, the volume of developing solution that can be stored in each tube 71*a* (hereinafter referred to simply as the "volume" in some cases) is set so that this volume increases in the order in which the coating liquid nozzle parts 71*b* are aligned in the radial direction of the substrate from the central axis of rotation Z of the substrate 12. In this second embodiment, the length of the tubes 71*a* increases toward the circumferential edge of the substrate 12 from the center O of the substrate 12; accordingly, the lengths of the respective tubes 71*a* correspond to the heights of the coating liquid buffer parts 21*a* in the first embodiment.

Since first and second coating liquid nozzle parts (71*b*R, 71*b*L) are provided in left-right symmetrical positions on both sides of the central axis of rotation Z, the coating distribution of the developing solution on the substrate is such that ten annular regions that are centered on a circular region centered on the center of rotation O are successively formed on the outside of this circular region, as in the first embodiment. To describe this in greater detail, the semicircular region 50R (see FIG. 1(B)) on the upper side of the substrate is a region that is coated with the developing solution that is discharged from the first coating liquid nozzle parts 71*b*R, while the semicircular region 50L (see FIG. 1(B)) on the lower side of the substrate is a region that is coated with the developing solution that is discharged from the second coating liquid nozzle parts 71*b*L.

Thus, since the regions that are being coated with the developing solution on the surface of the substrate 12 increase in size as the positions of the coating liquid nozzle parts 71*b* that discharge the developing solution are located further from the center of rotation O of the substrate 12 in the radial direction, the volumes of the tubes 71*a* that correspond to these coating liquid nozzle parts 71*b* are set so that these volumes increase in accordance with the increase in the size of the coating regions in the coating apparatus 10 of this embodiment.

Furthermore, if the cross-sectional areas of the respective tubes 71*a* are the same, then the volumes of these tubes 71*a* depend on the lengths of the respective tubes 71*a*. In the example of construction shown in FIG. 4, the respective tubes 71*a* are installed along circular arcs that are centered on the center of rotation O; accordingly, the lengths of the respective tubes 71*a* are the lengths of these circular arcs. Since the lengths of these circular arcs differ for adjacent tubes 71*a*, the volumes of the respective tubes 71*a* also differ. Furthermore, if the widths of the regions coated by the respective coating liquid nozzle parts 71*b* in the radial direction of the substrate are the same, then the areas of the respective coating regions also depend on the lengths of the circular arcs.

In concrete terms, for example, when an exposed substrate (wafer) with a diameter of 200 mm is coated with a developing solution using the coating apparatus 10, flexible Teflon (registered trademark) tubes (external diameter 6 mm and internal diameter 4 mm) constituting the tubes 71*a* are installed (as one example) so that the distance (center-to-center distance) between the outermost tube 71*a* and the center of rotation O is 91 mm, and so that the tubes are installed toward the inside (toward the center of rotation O) at a spacing of 8.5 mm. Furthermore, the height (standing height) of the developing solution on the substrate 12 varies according to the contact angle between the resist that is formed on the substrate and the developing solution that is used, and the area of the resist that is dissolved by the developing solution; in the present example of construction, however, there is no insufficiency if this height is set at approximately 1 mm. Accordingly, for example, in cases where the height of the developing solution is set at approximately 1 mm, as in the description of the first embodiment, the necessary amounts of developing solution calculated from the coating regions corresponding to the respective coating liquid nozzle parts 71*b* are such that the volumes of the tubes 71*a* corresponding to the outside coating liquid nozzle parts 71*b* from the respective coating liquid nozzle parts 71*b* of the first coating liquid nozzle parts 71*b*R are set in order from the region corresponding to the coating liquid nozzle part 71*b* on the side of the center of rotation O so that these volumes are approximately 177.5 mm$^3$, approximately 428.9 mm$^3$, approximately 680.3 mm$^3$, approximately 931.7 mm$^3$, approximately 1183.2 mm$^3$, approximately 1434.6 mm$^3$, approximately 1686.0 mm$^3$, approximately 1937.4 mm$^3$, approximately 2188.8 mm$^3$, approximately 2440.3 mm$^3$ and approximately 2691.7 mm$^3$. Furthermore, in this example of construction, the diameter of the plurality of circular openings 73 that constitute each coating liquid nozzle part 71b is set at approximately 1 mm. Moreover, the number of openings 73 in each coating liquid nozzle part 71b is set on the basis of the volume of the corresponding tube 71a; in order from the innermost tube 71a, the number of openings is set at 11 openings, 5 openings, 13 openings, and 9 openings, and then at 9 openings for all subsequent coating liquid nozzle parts 71b. Furthermore, respective tubes 71a with the same volumes as those described above are also installed on the side of the second coating liquid nozzle parts 71bL.

Figure 6A:
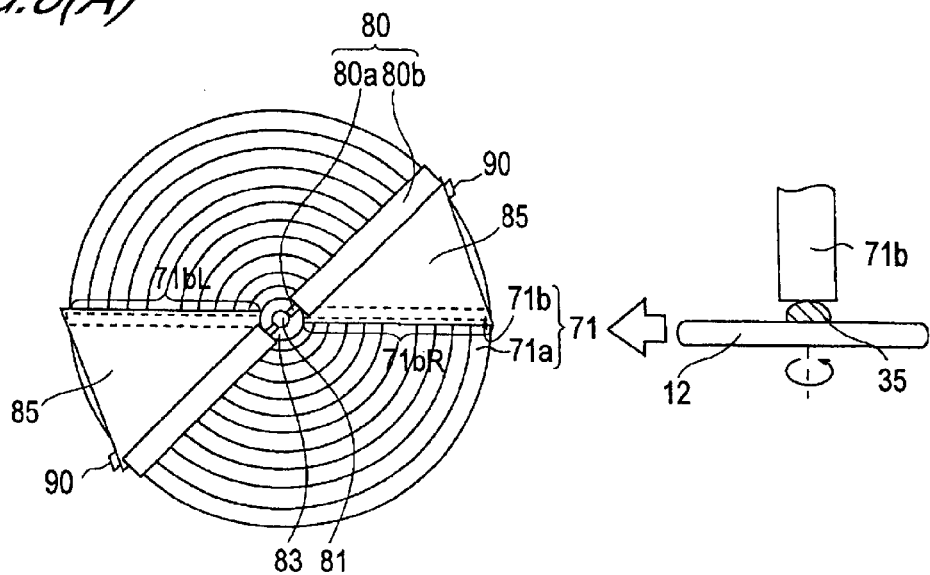
FIGS. 6(A) and 6(B) are diagrams used to illustrate a liquid coating method using the liquid coating apparatus of the second embodiment of the present invention.
Figure 6B:
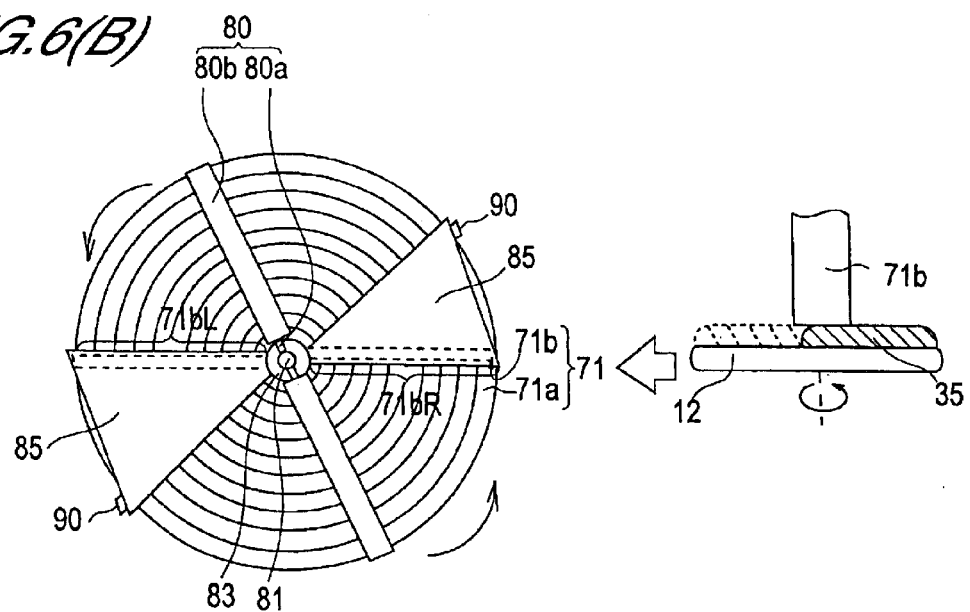
Figure 7:
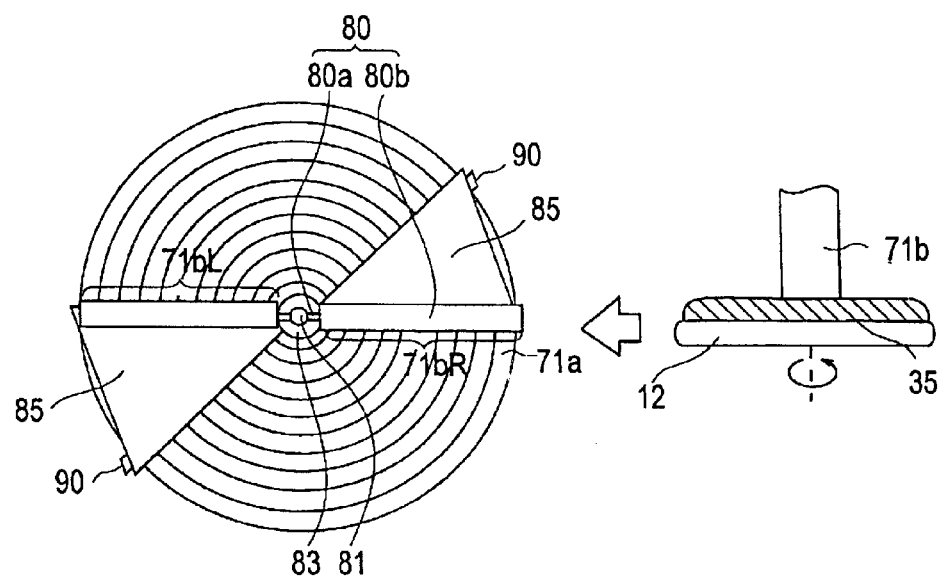
FIG. 7 is a diagram used to illustrate a liquid coating method using the liquid coating apparatus of the second embodiment of the present invention.

Next, a coating method for a coating liquid using the coating apparatus 10 will be described with reference to FIGS. 6 and 7. Furthermore, in FIGS. 6(A), 6(B) and 7, the schematic diagrams on the right are schematic diagrams that show the coating conditions of the substrate 12 coated with the developing solution 35 by the coating apparatus 10 shown on the left, as seen from the direction indicated by the white arrows in the figures. The region surrounded by a broken line shown on the right of FIG. 6(B) is the region coated by the second (left-side) coating liquid nozzle parts 71bL.

First, in the waiting position, the respective empty tubes 71a having the volumes in the coating liquid discharge part assembly 70 are filled with volumes of developing solution (not shown in the figures) equal to the volumes of these tubes 71a from the coating liquid supply ports 90 via communicating pipes (not shown in the figures). Furthermore, if a method in which the developing solution is supplied to the respective tubes 71a suing pressurized nitrogen gas is used when the respective tubes 71a are filled with the developing solution, this filling can be accomplished quickly and easily, so that such a method is effective.

Afterward, the coating liquid discharge part assembly 70 is moved to a position which is located above the disk-form substrate (diameter 200 m; the resist is not shown in the figures) 12 that is carried on the substrate rotating part 30, and which is located on a straight line (diameter) that passes through the center of rotation O of the substrate 12, and the coating liquid discharge part assembly 70 is stopped in a position which is such that the gap between the surface of the substrate 12 and the developing liquid nozzle parts 71b is approximately 1 mm.

Next, rotation of the substrate 12 is initiated at a rotational speed of 30 rpm in the direction indicated by the arrow. At the same time that the rotation of the substrate 12 is initiated, the rotational driving source 83 is actuated so that the rollers 80 are moved. The rotational speed of the rollers 80 in this case is set at 180/135 times the rotational speed of the substrate 12, in consideration of the fact that the rollers 80 are moved by ⅜ of a rotation (135°) while the substrate 12 is completing ½ rotation (180°). Accordingly, in this embodiment, since the rotational speed of the substrate 12 is 30 rpm, the rotational speed of the rollers 80 is set at 40 rpm. Thus, the rollers 80 are moved from the developing solution supply port 90 at one end of each tube 71a toward the developing solution nozzle part 71b at the other end of each tube 71a while the rollers 80 press the tubes 71a. The time of initiation of the discharge is shown in FIG. 6(A) For example, when a period of 0.5 seconds has elapsed, since the substrate 12 has rotated by ¼ rotation (90°) in the direction indicated by the arrow as shown in FIG. 6(B) (in this case, the rollers 80 have moved by 3/16 of a rotation (67.5°)), approximately ½ of the substrate 12 has been coated with the developing solution 35 at this point in time. Then, when a period of 1 second has elapsed, the discharge of the developing solution 35 is stopped. Furthermore, the rotation of the substrate 12 is stopped at the same time. The rollers 80 move from the developing solution supply port 90 at one end of each tube 71a to the developing solution nozzle part 71b at the other end of each tube 71a.

Afterward, the coating liquid discharge part assembly 70 is moved so that the gap between the substrate 12 and the coating liquid nozzle parts 71b is approximately 5 mm. Thus, when a period of 1 second has elapsed, the substrate 12 has rotated by ½ rotation (180°) in the direction indicated by the arrow (in this case, the rollers 80 have moved by ⅜ of a rotation (135°)). Accordingly, in this case, the entire surface of the substrate 12 is coated with the developing solution 35 (FIG. 7).

Furthermore, the discharge of the developing solution 35 onto the upper surface of the substrate 12, i.e., the application of the developing solution 35 to the surface of the substrate 12 as a coating, is accomplished by utilizing the fact that the developing solution inside the tubes 71a is discharged from the respective coating liquid nozzle parts 71b when the tubes 71a are pressed by the rollers 80. Moreover, when a period of 1 second has elapsed, the total amount of the developing solution 35 stored inside the respective tubes 71a is discharged; accordingly, there is substantially no developing solution 35 remaining in these tubes 71a, and substantially the entire amount of the developing solution 35 with which the tubes were filled is caused to cover the substrate 12.

Subsequently, after the substrate 12 has been maintained in a stationary state for a specified developing time, the desired resist pattern is obtained by successively performing a pure water rinsing step and a spin-drying step. Furthermore, while the pure water rinsing step and spin-drying step are being performed, the coating liquid discharge part assembly 70 may be moved to the waiting position, and the respective empty tubes 71a that have been used may be filled with fresh developing solution via the coating liquid supply ports 90 and prepared for the next developing process.

In the liquid coating apparatus of the present embodiment, as is clear from the above description, the amount of developing solution stored in each tube 71a increases as this tube 71a is located in a position further from the center of rotation O of the substrate 12. Accordingly, each tube 71a is provided as a storage part which has the same volume as the required amount of developing solution calculated from the area of the region being coated that corresponds to the respective coating liquid discharge part 71 associated with this tube 71a.

As a result, the amount of developing solution that is discharged per unit area during the same time period is constant at every location on the upper surface of the substrate 12, so that there is no bias in the amount of developing solution supplied to the substrate 12 within the plane of the substrate 12; accordingly, a uniform film thickness can be obtained in the developing solution that covers the substrate.

Furthermore, for each coating region, the amount of developing solution that is stored in the corresponding tube 71a is set as the amount that is used up for one substrate. Accordingly, the excessive supply of developing solution to the substrate 12 can be prevented. Consequently, the amount of developing solution used can be reduced compared to conventional methods.

Furthermore, in this embodiment, the discharge time of the developing solution onto the substrate 12 can be controlled by appropriately adjusting the rpm of the substrate 12 and the rpm of the rollers 80. As a result, the discharge time can be optimized with consideration given to the relative ease of wetting of the developing solution with respect to the substrate on which the abovementioned resist is formed, which varies according to the resist material used.

Thus, the present invention is not limited exclusively to combinations of the abovementioned embodiments. Accordingly, the present invention can be applied by combining appropriate conditions in arbitrary appropriate stages.

For example, a construction may be used in which the discharge control part 87 of the second embodiment is substituted for the discharge control part 45 of the first embodiment.

Furthermore, in the first and second embodiments, examples were described in which left and right sets of coating liquid discharge parts 21, 71 arranged in a straight line passing through the center of the substrate were constructed by means of a coating liquid discharge part assembly 20 or 70. However, a construction may also be used in which coating liquid discharge parts 21 or 71 are installed on only one side of the center point of the substrate. In this case, it is sufficient to construct the system so that the respective coating liquid nozzle parts (21*b*, 71*b*) move 360° in relative terms over the surface of the substrate. Furthermore, for example, it would also be possible to install thee sets of coating liquid discharge parts 21 or 71 so that these sets form angles of 120°; in this case, it is sufficient to construct the system so that the respective coating liquid nozzle parts (21*b*, 71*b*) move 120° in relative terms over the surface of the substrate.

Furthermore, in the respective embodiments described above, the region being coated with the coating liquid by the coating apparatus 10 was a disk-form substrate. However, as long as the material being coated is a material used in electronic parts or the like, the size, shape and material involved are not limited to this example; the present invention can be arbitrarily applied.

Furthermore, in the respective embodiments described above, a resist patterning developing solution was used as the coating liquid. However, the present invention is not limited to such a coating liquid; any coating liquid appropriate for use may be used in the present invention.

Furthermore, a construction may also be used in which the plurality of regions being coated in the respective embodiments have different shapes or sizes, or both different shapes and sizes.

Furthermore, the constructions of the coating liquid discharge parts, discharge control parts and the like are not limited to the above examples; other constructions may be used as long as these constructions make it possible to expect a similar effect.

In the present invention, as is clear from the above description, the amounts of coating liquid per unit area that are supplied at the same time to the respective regions being coated are the same; accordingly, the coating liquid can be applied without any bias (within the regions being coated) in the amount of coating liquid that is supplied to the regions being coated. Consequently, the uniformity of the film thickness of the coating liquid that is caused to cover the regions being coated can be improved.

Furthermore, in the case of this coating apparatus structure, the excessive supply of the coating liquid to the regions being coated can be prevented; accordingly, the amount of coating liquid used, and therefore the amount of waste coating liquid, can be reduced compared to conventional techniques.

<Addendum>

The coating apparatus of the present invention for applying a coating liquid may preferably include the following constructions:

Specifically, in a coating apparatus which applies a coating liquid to a plurality of regions being coated, the present invention includes coating liquid discharge parts that are especially installed for each region being coated, and a discharge control part that controls the discharge of the coating liquid from the coating liquid discharge parts.

Here, the respective coating liquid discharge parts have storage chambers which store amounts of coating liquid that can coat the coating surfaces of the corresponding regions being coated to substantially the same coating thickness, and which have the same cross-sectional area but different lengths in the direction of extension, and nozzle parts that apply this coating liquid.

In this case, the amount of coating liquid per unit area of the region being coated that is applied to the corresponding region being coated from each coating liquid discharge part during a specified period of time is fixed.

It is possible to use a construction in which the respective storage chambers are arranged in a row from the central portion of the overall region being coated toward the outer periphery of the region being coated, and in which the storage chambers are installed so that the lengths of the storage chambers become longer from the central portion toward the outer periphery.

The regions being coated may include a circular region and annular regions which are successively formed to the outside of this circular region, so that these annular regions share the center of the circular region.

The respective nozzle parts may be constructed so that these nozzle parts have one or more discharge ports.

The discharge control part may include a construction that is used to fill each of the coating liquid discharge parts with the coating liquid, and a construction that is used for the simultaneous control of the load pressure applied to the coating liquid.

A construction may be used in which the respective storage chambers are installed so that these storage chambers are caused to extend in a direction perpendicular to the coating surfaces of the regions being coated.

A construction may be used in which the respective storage chambers are installed so that these storage chambers are caused to extend in a direction parallel to the coating surfaces of the regions being coated.

A supporting plate that supports a plurality of storage chambers above the regions being coated may also be included. In this case, the respective storage chambers may be provided side by side on the surface of the supporting plate, and may be formed by elastic tubular members. Furthermore, the discharge control part may include a pressing member that moves and presses the tubular members.

The regions being coated may be regions on one of the main surfaces of a disk-form substrate that can rotate about a central axis of rotation.

In this case, the coating liquid discharge parts may be arranged facing the main surface of the substrate in positions that are symmetrical with respect to the central axis of rotation.

The coating liquid used in the coating apparatus of the present invention may be a developing solution used for resist patterning.

What is claimed is:

1. A coating method for a coating liquid comprising:
   preparing a coating surface which has a plurality of regions that are to be coated with said coating liquid;
   providing a plurality of storage chambers under atmospheric pressure in which said coating liquid is stored in respective amounts that enable the coating surfaces of said corresponding regions to be coated to substantially a same coating thickness;

disposing said corresponding regions at undersides of said storage chambers; and applying said coating liquid on the coating surfaces of said corresponding regions by pushing said coating liquid stored in said storage chambers by said atmospheric pressure, wherein said storage chambers are provided so that said storage chambers extend in a direction perpendicular to the coating surfaces of said corresponding regions, said storage chambers have equal cross-sectional areas and different respective lengths along the extension direction, and amounts of said coating liquid that are proportional to said lengths are respectively stored in said respective storage chambers, and wherein said storage chambers are aligned in a specified direction that passes through a center of said corresponding regions, and wherein said lengths of said storage chambers are respectively greater from the center of said corresponding regions to an outer periphery of said corresponding regions.

2. The coating method according to claim 1, wherein said corresponding regions include a circular region, and annular regions that are successively formed at an outer periphery of said circular region, and said annular regions share a center of said circular region, and wherein said applying said coating liquid is performed by rotationally moving said corresponding regions and said storage chambers relative to each other about said center.

3. The coating method according to claim 1, wherein said corresponding regions are regions on one of main surfaces of a disk-form substrate that is rotatable about a central axis of rotation, and wherein said applying said coating is performed while said substrate and coating liquid discharge parts connected to said storage chambers are rotated relative to each other.

4. The coating method according to claim 1, wherein said coating liquid is a developing solution used for resist patterning.

5. The coating method according to claim 1, wherein said coating surface is a surface on which a plurality of semiconductor elements are formed.

6. A coating method for a coating liquid comprising:

preparing a coating surface which has a plurality of regions that are to be coated with said coating liquid;

providing a plurality of storage chambers in which said coating liquid is to be stored in respective amounts that enable the coating surfaces of said corresponding regions to be coated to substantially a same coating thickness;

disposing said corresponding regions at undersides of said storage chambers;

storing said coating liquid in coating liquid discharge parts of said storage chambers; and controlling load pressure applied to said stored coating liquid so that said stored coating liquid is discharged from nozzles installed on one end of said coating liquid discharge parts to the coating surfaces of said corresponding regions, wherein said storage chambers are provided so that said storage chambers extend in a direction perpendicular to the coating surfaces of said corresponding regions, said storage chambers have equal cross-sectional areas and different respective lengths along the extension direction, and amounts of said coating liquid that are proportional to said lengths are respectively stored in said respective storage chambers, and wherein said storage chambers are aligned in a specified direction that passes through a center of said corresponding regions, and wherein said lengths of said storage chambers are respectively greater from the center of said corresponding regions to an outer periphery of said corresponding regions.

7. The coating method according to claim 6, wherein said controlling load pressure comprises switching control of the load pressure by a discharge control part that communicates with said storage chambers, said switching control successively including switching of the load pressure that is applied to said coating liquid from a negative-pressure state to an instantaneous pressurized state at a time of initial discharge which is higher than atmospheric pressure, switching of the load pressure from said instantaneous pressurized state to a state of atmospheric pressure during normal discharge, and switching of the load pressure from said state of atmospheric pressure to a negative pressure state upon completion of discharge.

8. The coating method according to claim 6, wherein said corresponding regions are regions on one of main surfaces of a disk-form substrate that is rotatable about a central axis of rotation, and said controlling load pressure is performed while said substrate and said coating liquid discharge parts are rotated relative to each other.

9. The coating method according to claim 6, wherein said coating liquid is a developing solution used for resist patterning.

10. The coating method according to claim 6, wherein said coating surface is a surface on which a plurality of semiconductor elements are formed.

11. A coating method for a coating liquid comprising:

preparing a coating surface which has a plurality of regions that are to be coated with said coating liquid;

providing a plurality of storage chambers which are comprised of elastic tubular members, and in which said coating liquid is stored in respective amounts that enable the coating surfaces of said corresponding regions to be coated to substantially a same coating thickness, on an upper surface of a supporting plate which is provided horizontally with respect to the coating surfaces of said corresponding regions;

disposing said corresponding regions at undersides of said storage chambers; and applying said coating liquid on the coating surfaces of said corresponding regions from opening parts formed in said storage chambers, by moving said storage chambers while pressing said storage chambers toward said supporting plate.

12. The coating method according to claim 11, wherein said storage chambers have equal cross-sectional areas and respective different lengths along a direction of extension, and amounts of said coating liquid that are proportional to said lengths are respectively stored in said storage chambers.

13. The coating method according to claim 11, wherein said corresponding regions include a circular region, and annular regions that are successively formed at an outer periphery of said circular region, and said annular regions share a center of said circular region, and wherein said applying said coating liquid is performed by rotationally moving said corresponding regions and said storage chambers relative to each other about said center.

14. The coating method according to claim 11, wherein said storage chambers are arranged in a specified direction that passes through a center of said corresponding regions, and wherein lengths of said storage chambers are respectively greater from the center of said corresponding regions to an outer periphery of said corresponding regions.

15. The coating method according to claim 11, wherein said applying said coating liquid is performed by storing said coating liquid in coating liquid discharge parts of said storage chambers, and controlling load pressure applied to said stored coating liquid so that said stored coating liquid is discharged from nozzles installed on one end of each of said coating liquid discharge parts.

16. The coating method according to claim 15, wherein said controlling load pressure is performed by pressing said storage chambers from end portions on opposite sides from said nozzles toward said nozzles.

17. The coating method according to claim 11, wherein said corresponding regions are regions on one of main surfaces of a disk-form substrate that is rotatable about a central axis of rotation, and said applying said coating liquid is performed while said substrate and said coating liquid discharge parts are rotated relative to each other.

18. The coating method according to claim 11, wherein said coating liquid is a developing solution used for resist patterning.

19. The coating method according to claim 11, wherein said coating surface is a surface on which a plurality of semiconductor elements are formed.

* * * * *